(12) United States Patent
Sugimoto et al.

(10) Patent No.: US 11,450,774 B2
(45) Date of Patent: Sep. 20, 2022

(54) SEMICONDUCTOR DEVICE INCLUDING TWO OR MORE ADJUSTMENT REGIONS

(71) Applicant: FLOSFIA INC., Kyoto (JP)

(72) Inventors: Masahiro Sugimoto, Kyoto (JP); Isao Takahashi, Kyoto (JP); Hitoshi Kambara, Kyoto (JP); Takashi Shinohe, Kyoto (JP); Toshimi Hitora, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

(21) Appl. No.: 16/628,341

(22) PCT Filed: Jul. 6, 2018

(86) PCT No.: PCT/JP2018/025767
§ 371 (c)(1),
(2) Date: Jan. 3, 2020

(87) PCT Pub. No.: WO2019/013136
PCT Pub. Date: Jan. 17, 2019

(65) Prior Publication Data
US 2020/0152805 A1    May 14, 2020

(30) Foreign Application Priority Data
Jul. 8, 2017  (JP) .............................. JP2017-134243

(51) Int. Cl.
*H01L 29/872*    (2006.01)
*H01L 29/06*    (2006.01)
*H01L 29/47*    (2006.01)

(52) U.S. Cl.
CPC ........ *H01L 29/872* (2013.01); *H01L 29/0623* (2013.01); *H01L 29/47* (2013.01)

(58) Field of Classification Search
CPC ................. H01L 29/0623; H01L 29/47; H01L 29/66969; H01L 29/0619; H01L 29/04;
(Continued)

(56) References Cited

U.S. PATENT DOCUMENTS 10,115,834 B2    10/2018  Vobecky
2011/0215338 A1*  9/2011  Zhang .................... H01L 29/47
                                                            257/73

(Continued)

FOREIGN PATENT DOCUMENTS

| EP | 2 922 094 | 9/2015 |
| EP | 3 174 101 | 5/2017 |

(Continued)

OTHER PUBLICATIONS

International Search Report dated Sep. 25, 2018 in International (PCT) Application No. PCT/JP2018/025767 with English translation.

(Continued)

*Primary Examiner* — Shahed Ahmed
(74) *Attorney, Agent, or Firm* — Wenderoth, Lind & Ponack, L.L.P.

(57) ABSTRACT

A semiconductor device with an enhanced semiconductor characteristics that is useful for power devices. A semiconductor device including: a semiconductor region; a barrier electrode arranged on the semiconductor region; and two or more adjustment regions of barrier height that are on a surface of the semiconductor region and arranged between the semiconductor region and the barrier electrode, the adjustment regions are configured such that barrier height at an interface between the adjustment regions and the barrier electrode is higher than barrier height at an interface between the semiconductor region and the barrier electrode.

18 Claims, 13 Drawing Sheets

(58) Field of Classification Search
CPC ........... H01L 29/24; H01L 2924/12032; H01L 29/66143; H01L 29/66212; H01L 27/0766; H01L 29/872–8725; H01L 51/0579
See application file for complete search history.

(56) References Cited

U.S. PATENT DOCUMENTS

| | | | |
|---|---|---|---|
| 2012/0098082 A1 | 4/2012 | Hsu et al. | |
| 2012/0223333 A1* | 9/2012 | Mizukami | H01L 29/6606 257/77 |
| 2014/0061670 A1 | 3/2014 | Wada et al. | |
| 2014/0327019 A1* | 11/2014 | Kinoshita | H01L 29/47 257/77 |
| 2014/0357059 A1 | 12/2014 | Hsu et al. | |
| 2015/0129894 A1* | 5/2015 | Kinoshita | H01L 29/7801 257/77 |
| 2015/0270353 A1 | 9/2015 | Shimizu et al. | |
| 2017/0200790 A1* | 7/2017 | Hitora | H01L 21/02565 |
| 2017/0317173 A1* | 11/2017 | Uchida | H01L 21/02167 |
| 2019/0013389 A1* | 1/2019 | Kawashima | H01L 21/28 |
| 2019/0363197 A1 | 11/2019 | Sasaki et al. | |
| 2020/0144376 A1 | 5/2020 | Hitora et al. | |

FOREIGN PATENT DOCUMENTS

| | | |
|---|---|---|
| EP | 3 591 711 | 1/2020 |
| JP | 52-101970 | 8/1977 |
| JP | 1-270348 | 10/1989 |
| JP | 05-326925 | 12/1993 |
| JP | 10-84120 | 3/1998 |
| JP | 2006-318956 | 11/2006 |
| JP | 2006-352028 | 12/2006 |
| JP | 2008-172035 | 7/2008 |
| JP | 2009-252776 | 10/2009 |
| JP | 2010-225914 | 10/2010 |
| JP | 2013-522876 | 6/2013 |
| JP | 2014-53393 | 3/2014 |
| JP | 2014-78660 | 5/2014 |
| JP | 2014-107408 | 6/2014 |
| JP | WO2016/013554 | 1/2016 |
| JP | 2016-178182 | 10/2016 |
| JP | 2017-118090 | 6/2017 |
| JP | WO2017/111173 | 6/2017 |
| WO | 2012/054682 | 4/2012 |
| WO | 2016/198388 | 12/2016 |

OTHER PUBLICATIONS

Written Opinion of the International Searching Authority dated Sep. 25, 2018 in International (PCT) Application No. PCT/JP2018/025767 with English translation.
Extended European Search Report dated Feb. 25, 2021 in European Patent Application No. 18831783.8.
Communication pursuant to Article 94(3) EPC dated Jul. 6, 2022 in corresponding European Patent Application No. 18831783.8.

* cited by examiner

SEMICONDUCTOR DEVICE INCLUDING TWO OR MORE ADJUSTMENT REGIONS

TECHNICAL FIELD

The disclosure relates to a semiconductor device useful in power devices and the like. The disclosure also relates to a semiconductor system including the semiconductor device.

BACKGROUND ART

A semiconductor device including a Schottky barrier electrode that is arranged on a semiconductor substrate is known, and various Schottky barrier electrodes have been studied for the purposes of, for example, increasing a reverse direction withstand voltage or decreasing a forward direction turn-on voltage.

Patent Literature 1 describes to provide a first metal on a central portion of a semiconductor and forming a Schottky contact of a second metal and the semiconductor at a peripheral portion of the semiconductor. Here, barrier height between the first metal and the semiconductor is lower and barrier height between the second metal and the semiconductor is higher, in order to increase a reverse direction withstand voltage and to decrease a forward direction turn-on voltage.

Further, it has been also studied on a combination of a Schottky electrode and an Ohmic electrode. For example, Patent Literature 2 describes a wide band gap semiconductor device including a Schottky electrode made of a metal and an Ohmic electrode made of the same type of metal with the Schottky electrode that are arranged on a substrate, and describes that such a configuration enables to improve a thermal breakdown resistance in case that a high current such as a surge current flows in a forward direction. However, there is a problem in an adhesion at an interface of a Schottky junction and an Ohmic junction, an electrode material has to be limited, or there is a problem that barrier height changes depending on a temperature, and it is not necessarily satisfactory. Therefore, a semiconductor device with a low turn-on voltage and an enhanced thermal stability has been expected.

Patent Literature 3 describes a semiconductor device including electrically conductive guard ring that is connected to a main junction bonded on a Schottky electrode, via a short circuit portion, and describes that such a semiconductor device alleviates an electric field concentration and contributes to improving a withstand voltage. However, even when arranging a large number of guard rings, there is a problem of deteriorating a withstand voltage on the contrary because the guard rings are shorted to the main junction.

PRIOR ART DOCUMENT

Patent Literature

Patent Literature 1: JP S52-101970
Patent Literature 2 JP 2014-78660
Patent Literature 3: JP 2014-107408

SUMMARY OF INVENTION

Technical Problem

An object of the disclosure is to provide a semiconductor device with enhanced Schottky characteristics and enhanced semiconductor characteristics.

Solution to Problem

As a result of earnest examination to achieve the above object, the inventors found that, a following semiconductor device enables to decrease a turn-on voltage, enhance a thermal stability, and further enhance a withstand voltage. A semiconductor device including: a semiconductor region; a barrier electrode that is arranged on the semiconductor region; a two or more adjustment regions of barrier height that are embedded in a surface of the semiconductor region and arranged between the semiconductor region and the barrier electrode, the adjustment regions are configured such that barrier height at an interface of the adjustment regions and the barrier electrode is higher than barrier height at an interface between the semiconductor region and the barrier electrode. The inventors also found that the obtained semiconductor device can solve above-mentioned problem.

In addition, after learning the above findings, the inventors have made further research to reach the disclosures.

That is, the disclosure relates to the followings.

[1] A semiconductor device including: a semiconductor region provided on the semiconductor device; a barrier electrode arranged on the semiconductor region; and two or more adjustment regions of barrier height that are on a surface of the semiconductor region and arranged between the semiconductor region and the barrier electrode, the adjustment regions are configured such that barrier height at an interface between the adjustment regions and the barrier electrode is higher than barrier height at an interface between the semiconductor region and the barrier electrode.

[2] A semiconductor device including: a semiconductor region; a barrier electrode arranged on the semiconductor region; and two or more adjustment regions of barrier height that are embedded in a surface of the semiconductor region and arranged between the semiconductor region and the barrier electrode, the adjustment regions are configured such that barrier height at an interface between the adjustment regions and the barrier electrode is higher than barrier height at an interface between the semiconductor region and the barrier electrode.

[3] The semiconductor device of [1] above, wherein a first adjustment region of the two or more adjustment regions is arranged between a first end of the barrier electrode and the semiconductor region, and a second adjustment region of the two or more adjustment regions is arranged between a second end of the barrier electrode and the semiconductor region.

[4] The semiconductor device of [1] above, wherein the adjustment regions protrude into the barrier electrode.

[5] The semiconductor device of [1] above further including: a guard ring that is arranged at a peripheral portion of the barrier electrode.

[6] The semiconductor device of [5] above, wherein the guard ring is partly or wholly embedded in the surface of the semiconductor region.

[7] The semiconductor device of [1] above, wherein the barrier height at the interface between the barrier electrode and the adjustment regions is equal to or higher than 1 eV.

[8] The semiconductor device of [1] above, wherein the barrier electrode includes a metal as an electrode material.

[9] The semiconductor device of [1] above, wherein the semiconductor region includes a crystalline oxide semiconductor as a major component.

[10] The semiconductor device of [1] above, wherein the semiconductor region includes a gallium compound as a major component.

[11] The semiconductor device of [1] above, wherein the semiconductor region includes α-$Ga_2O_3$ or a mixed crystal of α-$Ga_2O_3$ as a major component.

[12] The semiconductor device of [1] or [2] above, wherein the adjustment regions include a p-type oxide semiconductor as a major component.

[13] The semiconductor device of [1] or [2] above, wherein the adjustment regions include, as a major component, a corundum-structured p-type oxide semiconductor or a hexagonal-structured p-type oxide semiconductor.

[14] The semiconductor device of [1] above, wherein the semiconductor device is a diode.

[15] The semiconductor device of [1] above, wherein the semiconductor device is a junction barrier Schottky diode.

[16] The semiconductor device of [1] above, wherein the semiconductor device is a power device.

[17] A semiconductor system including: the semiconductor device of any one of [1] to [16] above.

Advantageous Effects of Invention

Semiconductor device of the disclosure is excellent in Schottky characteristics and semiconductor characteristics.

BRIEF DESCRIPTION OF THE DRAWINGS

FIG. 10(a) illustrates the forward direction measurement result, and FIG. 10(b) illustrates the reverse direction measurement result.

DESCRIPTION OF EMBODIMENTS

Figure 1:
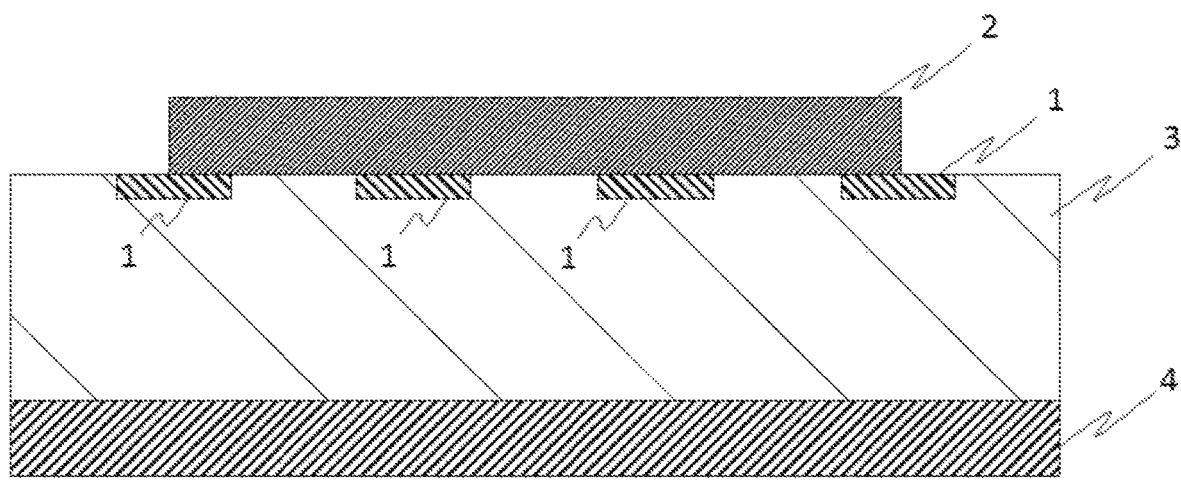
FIG. 1 is a schematic diagram illustrating one or more embodiments of a junction barrier Schottky diode (JBS).

A semiconductor device according to one or more embodiments of the disclosure includes: a semiconductor region; a barrier electrode arranged on the semiconductor region; and two or more adjustment regions of barrier height that are on a surface of the semiconductor region and arranged between the semiconductor region and the barrier electrode, the adjustment regions are configured such that barrier height at an interface between the adjustment regions and the barrier electrode is higher than barrier height at an interface between the semiconductor region and the barrier electrode.

Further, an semiconductor device according to one or more embodiments of the disclosure is a semiconductor device including: a semiconductor region; a barrier electrode arranged on the semiconductor region; and two or more adjustment regions of barrier height that are embedded in a surface of the semiconductor region and arranged between the semiconductor region and the barrier electrode, the adjustment regions are configured such that barrier height at an interface between the adjustment regions and the barrier electrode that is higher than barrier height at an interface between the semiconductor region and the barrier electrode.

According to one or more embodiments of the disclosure, the adjustment regions preferably protrude into the barrier electrode. According to one or more embodiments of the disclosure, it is more preferable that the adjustment regions are embedded in a surface of the semiconductor region and protrude into the barrier electrode. The semiconductor device according to the preferred embodiments of the disclosure enables to further suppress an electric field concentration and further reduce a contact resistance.

The barrier electrode is not particularly limited as long as the barrier electrode forms a Schottky barrier having a specific barrier height with the semiconductor region. An electrode material of the barrier electrode is not particularly limited as long as the electrode material can be used as a barrier electrode, and may be an electrically conductive inorganic material or an electrically conductive organic material. According to one or more embodiments of the disclosure, it is preferable that the electrode material is a metal. The metal is not particularly limited, but is preferably, for example, at least one metal selected from the Group 4 to the Group 11 of the periodic table. Examples of the metal of the Group 4 of the periodic table include titanium (Ti), zirconium (Zr) and hafnium (Hf), but Ti is preferred. Examples of the metal of the Group 5 of the periodic table include vanadium (V), niobium (Nb) and tantalum (Ta). Examples of the metal of the Group 6 of the periodic table include one or more metals selected from chromium (Cr), molybdenum (Mo) and tungsten (W). According to one or more embodiments of the disclosure, Cr is preferred for a reason that semiconductor properties such as switching characteristics would be further improved. Examples of the metal of the Group 7 of the periodic table include manganese (Mn), technetium (Tc) and rhenium (Re). Examples of the metal of the Group 8 of the periodic table include iron (Fe), ruthenium (Ru) and osmium (Os). Examples of the metal of the Group 9 of the periodic table include cobalt (Co), rhodium (Rh) and iridium (Ir). Examples of the metal of the Group 10 of the periodic table include nickel (Ni), palladium (Pd) and platinum (Pt), but Pt is preferred. Examples of the metal of the Group 11 of the periodic table include copper (Cu), silver (Ag) and gold (Au). Examples of a forming method of the barrier electrode include a known method and more specifically, a dry method and a wet method. The dry method may be, for example, sputtering, vacuum evaporation, or a known method such as CVD. The wet method may be, for example, screen printing or die coating.

The semiconductor region is not particularly limited as long as the semiconductor region includes a semiconductor as a major component, but according to one or more embodiments of the disclosure, the semiconductor region preferably includes a crystalline oxide semiconductor as a major component. According to one or more embodiments of the disclosure, it is more preferably that the semiconductor region is an n-type semiconductor region including an n-type semiconductor as a major component. The crystalline oxide semiconductor contained in the semiconductor region preferably includes a β-gallia structure or a corundum structure, and more preferably includes a corundum structure. Further, the semiconductor region also preferably contains a gallium compound as a major component, more preferably contains an InAlGaO-based semiconductor as a major component, and most preferably contains $\alpha$-$Ga_2O_3$ or a mixed crystal of $\alpha$-$Ga_2O_3$ as a major component. The term "major component" herein means, for example, if the crystalline oxide semiconductor is $\alpha$-$Ga_2O_3$, $\alpha$-$Ga_2O_3$ is contained in the semiconductor region under the condition that an atomic ratio of gallium in all metal elements contained in the semiconductor region is equal to or more than 0.5. According to one or more embodiments of the disclosure, it is preferable that the atomic ratio of gallium in all metal elements contained in the semiconductor region is equal to or more than 0.7, and more preferably equal to or more than 0.8. Further, the semiconductor region is in general a single-phase region, but may include a second semiconductor region including a different semiconductor phase, or may include other phases, unless it deviates from an object of the disclosure. Further, the semiconductor region is in general in the shape of a film, and may be a semiconductor film. A thickness of the semiconductor film of the semiconductor region is not particularly limited, but may be equal to or less than 1 µm or equal to or more than 1 µm. According to one or more embodiments of the disclosure, the thickness of the semiconductor film is preferably in a range of from 1 µm to 40 µm and is more preferably in a range of from 1 µm to 25 µm. A surface area of the semiconductor film is not particularly limited, but may be equal to or more than 1 mm$^2$, or may be equal to or less than 1 mm$^2$. The crystalline oxide semiconductor is in general a single crystal, but may be polycrystalline. Further, the semiconductor film may be a single layer film and may be a multilayer film. When the semiconductor film is the multilayer film, the multilayer film is preferably has a thickness of equal to or less than 40 µm. Also, in case that the multilayer film includes at least a first semiconductor layer and a second semiconductor layer, and the Schottky electrode is arranged on the first semiconductor layer, a carrier concentration of the first semiconductor layer is preferably smaller than a carrier concentration of the second semiconductor layer. In this case, the second semiconductor layer, in general includes a dopant, and a carrier concentration of the semiconductor layer may be appropriately set, by adjusting a doping amount.

The semiconductor film preferably includes a dopant. The dopant is not particularly limited and may be a known dopant. Examples of the dopant include an n-type dopant such as tin, germanium, silicon, titanium, zirconium, vanadium or niobium, and a p-type dopant. According to one or more embodiments of the disclosure, the dopant is preferably Sn, Ge or Si. A concentration of the dopant, in the composition of the semiconductor film is preferably equal to or more than 0.00001 atom %, more preferably in a range of from 0.00001 atom % to 20 atom %, and the most preferably in a range of from 0.00001 atom % to 10 atom %. According to one or more embodiments of the disclosure, it is preferable that a dopant used for the first semiconductor layer is germanium, silicon, titanium, zirconium, vanadium or niobium, and a dopant used for the second semiconductor layer is tin, for a reason to further enhance semiconductor characteristics without impairing an adhesion.

The semiconductor film may be obtained, for example, by a method such as mist CVD, and more specifically, the semiconductor film may be preferably obtained by a method including, turning a raw material solution into atomized droplets (atomization step), carrying the obtained atomized droplets to a base with a carrier gas (carrying step), then, depositing a semiconductor film containing a crystalline oxide semiconductor as a major component on the base by thermally reacting the atomized droplets in the deposition chamber (deposition step).

(Atomization Step)

At an atomization step, the raw material solution is turned into atomized droplets. A method of forming atomized droplets from the raw material solution is not particularly limited, as long as the raw material solution is able to be turned into atomized droplets, and may be a known method. According to one or more embodiments of the disclosure, a method of forming atomized droplets using ultrasonic vibration is preferable.

Atomized droplets including mist particles and obtained by using ultrasonic vibration and floating in the space have the initial velocity that is zero. Since atomized droplets floating in the space is carriable as a gas, the atomized droplets floating in the space are preferable to avoid damage caused by the collision energy without being blown like a spray. A size of the atomized droplets is not limited to a particular size, and may be a few mm, however, the size of atomized droplets is preferably equal to or less than 50 µm. The size of droplets is further preferably in a range of from 100 nm to 10 µm.

(Raw Material Solution)

The raw material solution is not particularly limited as long as the atomized droplets can be formed from the raw material solution and as long as the raw material solution includes a raw material capable of forming the semiconductor region. According to one or more embodiments of the disclosure, the raw material is preferably a metal or a metal compound, and more preferably contains one or more metals selected from among gallium, iron, indium, aluminum, vanadium, titanium, chromium, rhodium, nickel, cobalt, zinc, magnesium, calcium, silicon, yttrium, strontium and barium.

According to one or more embodiments of the disclosure, a raw material solution containing at least one metal, in a form of complex or salt, dissolved or dispersed in an organic solvent or water may be used. Examples of the form of the complex include an acetylacetonate complex, a carbonyl complex, an ammine complex and a hydride complex. Examples of the form of the salt includes an organic metal salt (e.g., metal acetate, metal oxalate, metal citrate, etc.), metal sulfide, metal nitrate, phosphorylated metal and metal halide (e.g., metal chloride, metal bromide, metal iodide, etc.).

Further, raw material solution may contain a hydrohalic acid and/or an oxidant as an additive. Examples of the hydrohalic acid include hydrobromic acid, hydrochloric acid and hydroiodic acid. Among all, hydrobromic acid or hydroiodic acid may be preferable for a reason to obtain a film of better quality. Examples of the oxidant include hydrogen peroxide ($H_2O_2$), sodium peroxide ($Na_2O_2$), barium peroxide ($BaO_2$), a peroxide including benzoyl peroxide ($(C_6H_5CO)_2O_2$), hypochlorous acid (HClO), perchloric acid, nitric acid, ozone water, and an organic peroxide such as peracetic acid and nitrobenzene.

The raw material solution may contain a dopant. By adding a dopant into the raw material solution, it is possible to preferably perform doping. The dopant is not particularly limited unless it deviates from an object of the disclosure. Examples of the dopant include n-type dopants. The n-type dopants may include tin, germanium, silicon, titanium, zirconium, vanadium or niobium. Also, examples of the dopant include p-type dopants. The dopant concentration in general may be approximately in a range of from $1\times10^{16}/cm^3$ to $1\times10^{22}/cm^3$. The dopant concentration may be at a lower concentration of, for example, approximately equal to or less than $1\times10^{17}/cm^3$. According to one or more embodiments of the disclosure, the dopant may be contained at a high concentration of, for example, approximately equal to or more than $1\times10^{20}/cm^3$. According to one or more embodiments of the disclosure, it is preferable that the dopant is contained in a carrier concentration of equal to or more than $1\times10^{17}/cm^3$.

A solvent of the raw material solution is not particularly limited unless it deviates from an object of the disclosure, and the solvent may be an inorganic solvent such as water. The solvent may be an organic solvent such as alcohol. Also, the solvent may be a mixed solvent of the inorganic solvent and the organic solvent. According to one or more embodiments of the disclosure, the solvent preferably includes water. According to one or more embodiments of the disclosure, the solvent is more preferably water or a mixed solvent of water and alcohol.

(Carrying Step)

At a carrying step, the atomized droplets are delivered to a deposition chamber by using a carrier gas. The carrier gas is not particularly limited unless it deviates from an object of the disclosure. Examples of the carrier gas includes oxygen, ozone, an inert gas such as nitrogen or argon and a reduction gas such as hydrogen gas or a forming gas. Further, the carrier gas may contain one or two or more gasses. Also, a diluted gas (e.g., 10-fold diluted carrier gas) and the like may be further used as a second carrier gas. The carrier gas may be supplied from one or more locations. While a flow rate of the carrier gas is not particularly limited, but may be preferably in a range of from 0.01 L/min to 20 L/min and more preferably in a range of from 1 L/min to 10 L/min. For the diluted carrier gas, a flow rate of the dilute carrier gas may be preferably in a range of from 0.001 L/min to 2 L/min, and more preferably in a range of from 0.1 L/min to 1 L/min.

(Deposition Step)

At a deposition step, the semiconductor film is deposited on the base by a thermal reaction of the atomized droplets in a deposition chamber. The thermal reaction is not particularly limited as long as the atomized droplets react with heat, and reaction conditions and the like are not particularly limited unless it deviates from an object of the disclosure. In the deposition step, the thermal reaction is in general carried out at an evaporation temperature of the solvent of the raw material solution or at a higher temperature than the evaporation temperature. The temperature during the thermal reaction is equal to or less than a too high temperature (for example, 1000° C.), and preferably equal to or less than 650° C., and more preferably in a range of from 300° C. to 650° C. Further, the thermal reaction may be conducted, unless it deviates from an object of the disclosure, in any atmosphere of a vacuum, a non-oxygen atmosphere, a reducing gas atmosphere and an oxygen atmosphere, but the thermal reaction may be preferably conducted in a non-oxygen atmosphere or an oxygen atmosphere. Further, the thermal reaction may be conducted in any conditions of under atmospheric pressure, under increased pressure, and under a reduced pressure. According to one or more embodiments of the disclosure, the thermal reaction may be preferably conducted under an atmospheric pressure. Further, a film thickness can be set by adjusting a deposition time.

(Base)

A base is not particularly limited as long as the base can support the semiconductor film. A material of the base is not particularly limited unless it deviates from an object of the disclosure, and may be a known base. The base may be an organic compound, or may be an inorganic compound. The base may be in any shape, and can perform for any shape. Examples of the shape of the base includes plate such as flat plate or a disc, fibrous, bar, columnar, prismatic, cylindrical, spiral, spherical and annular. According to one or more embodiments of the disclosure, the base is preferably a substrate. A thickness of the substrate is not particularly limited according to one or more embodiments of the disclosure.

The substrate is not particularly limited as long as the substrate is in the shape of plate and can support the semiconductor film. The substrate may be an insulator substrate, a semiconductor substrate, a metal substrate or a conductive substrate, however, the substrate is preferably an insulator substrate and also preferably a substrate having a metal film on a surface thereof. Examples of the substrate include a substrate including a substrate material with a corundum structure as a major component, a substrate including a substrate material with a β-Gallia structure as a major component or a substrate including a substrate material with a hexagonal structure as a major component. The term "major component" herein means that the substrate preferably contains a substrate material with a particular crystalline structure at an atomic ratio of 50% or more to all components of a substrate material contained in the substrate. The substrate preferably contains the substrate material with the particular crystalline structure at an atomic ratio of 70% or more to all components of the substrate material contained in the substrate and more preferably contains at an atomic ratio of 90% or more. The substrate may contain the substrate material with the particular crystalline structure at an atomic ratio of 100% to all components of the substrate material contained in the substrate.

The substrate material is not particularly limited as long as it deviates from an object of the disclosure, and may be a known substrate material. Examples of the substrate material with the corundum structure include α-$Al_2O_3$ (sapphire substrate) or α-$Ga_2O_3$. Also, preferable examples of the substrate material with the corundum structure include an a-plane sapphire substrate, an m-plane sapphire substrate, an r-plane sapphire substrate, a c-plane sapphire substrate and an α-type gallium oxide substrate (a-plane, m-plane or r-plane). Examples of the substrate including the substrate material with the β-Gallia structure as a major component include a β-Ga$_2$O$_3$ substrate or a mixed crystal substrate containing Al$_2$O$_3$ and Ga$_2$O$_3$ where Al$_2$O$_3$ is more than 0 wt % and equal to or less than 60 wt %. Examples of the substrate including the substrate material with a hexagonal structure include a SiC substrate, a ZnO substrate and a GaN substrate.

According to one or more embodiments of the disclosure, annealing may be performed after the deposition step. An annealing temperature is not particularly limited unless it deviates from an object of the disclosure. The annealing temperature may be generally in a range of from 300° C. to 650° C., and may be preferably in a range of from 350° C. to 550° C. An annealing time is generally in a range of from 1 minute to 48 hours, preferably in a range of from 10 minutes to 24 hours, and more preferably in a range of from 30 minutes to 12 hours. The annealing may be performed in any atmosphere unless it deviates from an object of the disclosure, and is preferably performed in a non-oxygen atmosphere, more preferably performed in a nitrogen atmosphere.

According to one or more embodiments of the disclosure, the semiconductor film may be provided directly on the base, or may be provided via another layer such as a buffer layer or a stress relief layer. A forming method of each layer is not particularly limited and may be a known method, however, a mist CVD method is preferred according to one or more embodiments of the disclosure.

Also, according to one or more embodiments of the disclosure, the semiconductor film that is separated from the base and the like by use of a known method may be used as the semiconductor region. The semiconductor film may be used as the semiconductor region, as it is.

An adjustment region of the two or more adjustment regions of barrier height is not particularly limited as long as a barrier height at an interface between the adjustment region and the semiconductor region or the barrier electrode is higher than barrier height at an interface between the semiconductor region and the barrier electrode. The adjustment region generally contains an electrically conductive material as a major component where a barrier height at an interface between the adjustment region and the semiconductor region or the barrier electrode is higher than barrier height at an interface between the semiconductor region and the barrier electrode. The term "major component" herein means that the electrically conductive material is contained in the adjustment region at an atomic ratio of 50% or more in all components contained in the adjustment region. The electrically conductive material is preferably contained in the adjustment region at an atomic ratio of 70%, or more, more preferably 90% or more, may be 100%. The electrically conductive material is not particularly limited unless it deviates from an object of the disclosure, but may be preferably a metal oxide or a metal. Examples of the metal oxide of the electrically conductive material include the above mentioned crystalline oxide semiconductor described as the major component of the semiconductor region. Examples of the metal of the electrically conductive material include the above mentioned metals described as the barrier electrode. Also, the barrier height may be adjusted by controlling an oxygen concentration, an impurity concentration, an interface state density, a terminal structure, a crystal structure or a surface irregularities, or modulating a work function or an electron affinity, by use of a known method. According to one or more embodiments of the disclosure, the adjustment region preferably contains a p-type semiconductor as a major component. Examples of the p-type semiconductor include a crystalline oxide semiconductor that is p-type doped by use of a p-type dopant (preferably Mg, Zn or Ca). The p-type semiconductor preferably has a corundum structure or a hexagonal structure, and more preferably has a corundum structure. Also, according to one or more embodiments of the disclosure, the p-type semiconductor is preferably an oxide semiconductor containing gallium. According to one or more embodiments of the disclosure, the p-type semiconductor more preferably contains an InAlGaO-based semiconductor as a major component, and the most preferably contains α-Ga$_2$O$_3$ or a mixed crystal of α-Ga$_2$O$_3$ as a major component. The p-type semiconductor preferably used in the adjustment region may be obtained by, for example, mist-CVD method using a raw material solution including a metal and additionally including the p-type dopant and hydrobromic acid. Each step and each condition of the mist CVD method may be the same as each step and each condition of the atomization step, the carrying step and the deposition step.

According to one or more embodiments of the disclosure, barrier height of the Schottky barrier between the adjustment layer and the barrier electrode is preferably adjusted so as to be equal to or more than 1 eV. By adjusting to such preferred barrier height, the semiconductor characteristics (e.g., switching characteristics and the like) of the semiconductor device according to one or more embodiments of the disclosure would be further enhanced. A number of the adjustment region is not particularly limited as long as the number is equal to or more than two. According to one or more embodiments of the disclosure, the number of the adjustment region is preferably equal to or more than three and more preferably equal to or more than four, for a reason to obtain the semiconductor device with further enhanced semiconductor characteristics.

A method of forming the adjustment regions is not particularly limited unless it deviates from an object of the disclosure. The adjustment regions may be formed by, for example, providing two or more trenches in a surface of the semiconductor region having an interface between the semiconductor region and the barrier electrode, and then, forming a film of the major component of the adjustment region, inside the trenches. Also, the adjustment regions may be formed by, for example, modifying a surface of a part of the semiconductor region using a known surface treatment method such as dry etching, wet etching, plasma treatment, ultraviolet treatment, heat treatment or a surface treatment by used of an organic solvent or an organic acid, and then, forming the barrier electrode on the surface modified region of the semiconductor region. Further, the adjustment regions may be formed by, for example, annealing (electron-beam annealing, laser annealing, etc.) a part of a junction between the semiconductor region and the barrier electrode, after or during forming the junction. Furthermore, according to one or more embodiments of the disclosure, the adjustment regions may be formed by a method combining the above-described methods of forming the adjustment regions. The adjustment regions may be formed in a vacuum atmosphere, in an atmospheric condition, or in a particular gas atmosphere.

The semiconductor device generally includes an Ohmic electrode. The Ohmic electrode is not particularly limited unless it deviates from an object of the disclosure and may be a known electrode material. The Ohmic electrode may contain a metal of the Group 4 and/or Group 11 of the periodic table. Preferred metal of the Group 4 and/or Group 11 of the periodic table used for the Ohmic electrode may be same as the metal contained in the Schottky electrode. Also, the Ohmic electrode may be a single metal layer or may include two or more metal layers. A method of forming the Ohmic electrode is not particularly limited. Examples of the method of forming the Ohmic electrode include a known method such as a vacuum evaporation method or a sputtering method. The metal contained in the Ohmic electrode may be an alloy. According to one or more embodiments of the disclosure, the Ohmic electrode preferably contains Ti and/or Au.

Hereinafter, although a preferable embodiments of the disclosure is described, the disclosure is not limited to these embodiments.

FIG. 1 illustrates a junction barrier Schottky diode (JBS) according to one or more embodiments of the disclosure. A semiconductor device of FIG. 1 includes a semiconductor region 3, a barrier electrode 2 provided on the semiconductor region and capable of forming a Schottky barrier with the semiconductor region, and an adjustment layer of barrier height that is provided between the barrier electrode 2 and the semiconductor region 3 and capable of forming a Schottky barrier with the semiconductor region. Here, barrier height at an interface between the adjustment layer 1 and the semiconductor region 3 is higher than barrier height at an interface between the barrier electrode 2 and the semiconductor region 3. The adjustment layer 1 is embedded in the semiconductor region 3. According to one or more embodiments of the disclosure, the adjustment layer is preferably provided at regular intervals, and is more preferably provided respectively between the semiconductor region and both ends of the barrier electrode. Such preferable embodiments enable to configure the JBS with enhanced thermal stability and adhesion, further reduced current leakage, and excellent in semiconductor characteristics such as withstand voltage. The semiconductor device illustrated in FIG. 1 further includes an Ohmic electrode 4 arranged on the semiconductor region 3.

A method of forming each layer included in the semiconductor device of FIG. 1 is not particularly limited unless it deviates from an object of the disclosure, and may be a known method. Examples of the method of forming the each layer include a method in which, after a film is formed using a vacuum evaporation method, a CVD method, a sputtering method or other various coating techniques, patterning is conducted by photolithography. Also, examples of the method of forming the each layer include a method in which patterning is conducted directly by using a printing technique and the like.

Figure 2A:
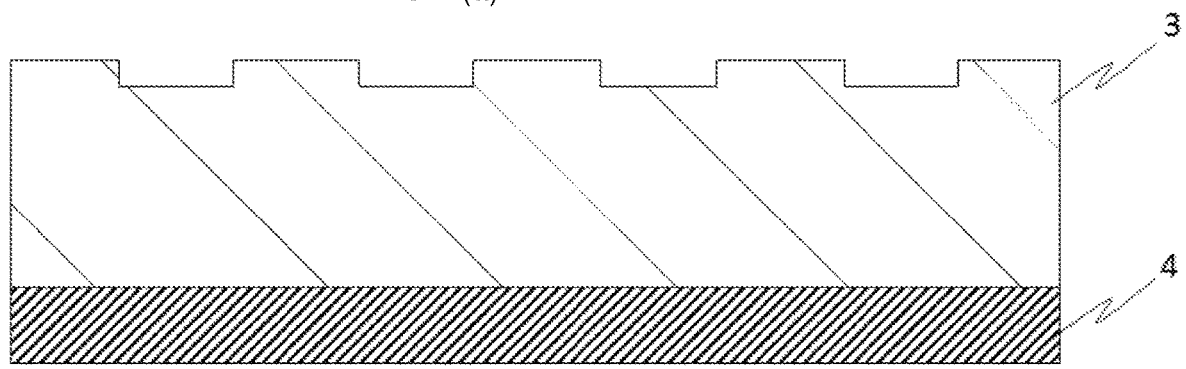
FIGS. 2(a)-2(c) are schematic diagrams illustrating one or more embodiments of a manufacturing process of the junction barrier Schottky diode (JBS) of FIG. 1.
Figure 2B:
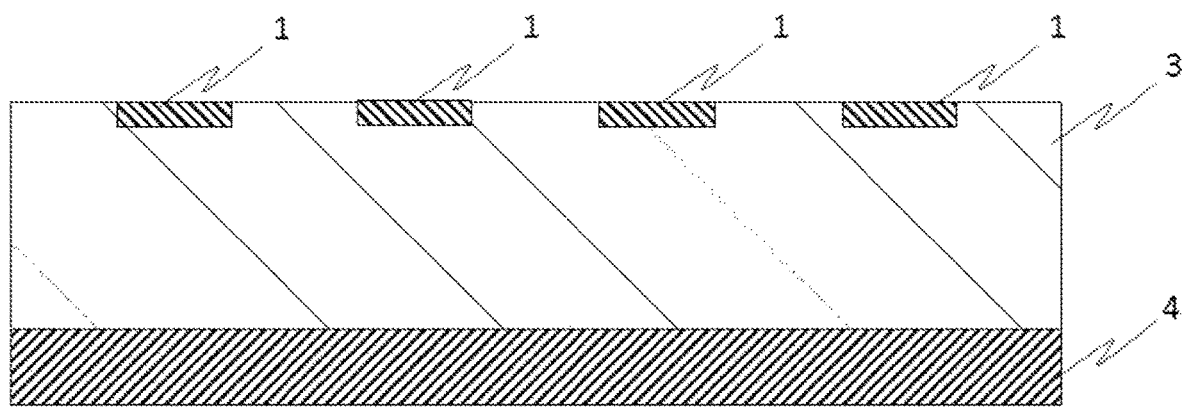
Figure 2C:
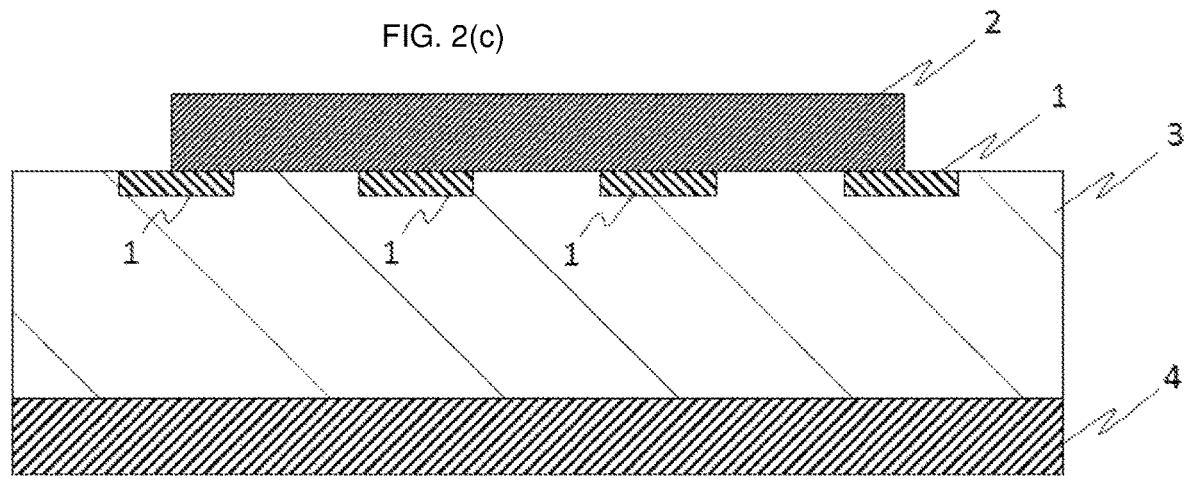

Hereinafter, with reference to FIG. 2, a preferred manufacturing process and the like of the semiconductor device of FIG. 1 is described. FIG. 2(a) illustrates a multilayer structure including a semiconductor substrate that is a semiconductor region 3, an Ohmic electrode 4 that is arranged on the semiconductor substrate, two or more trenches formed on a surface of the semiconductor substrate that is opposite to the Ohmic electrode of the semiconductor substrate. Forming an adjustment layer in the trenches of the semiconductor region 3 of the multilayer structure illustrated in FIG. 2(a) by using photolithography, as illustrated in FIG. 2(b). After obtaining the multilayer structure of FIG. 2(b), forming a barrier electrode 2 on the adjustment layer 1 and the semiconductor region 3 by using the dry method (preferably vacuum evaporation or sputtering) or the wet method, to obtain a multilayer structure of FIG. 2(c). The multilayer structure of FIG. 2(c) has a structure where the adjustment layer 1 is embedded in the semiconductor region, and thus, is particularly excellent in withstand voltage.

Figure 3:
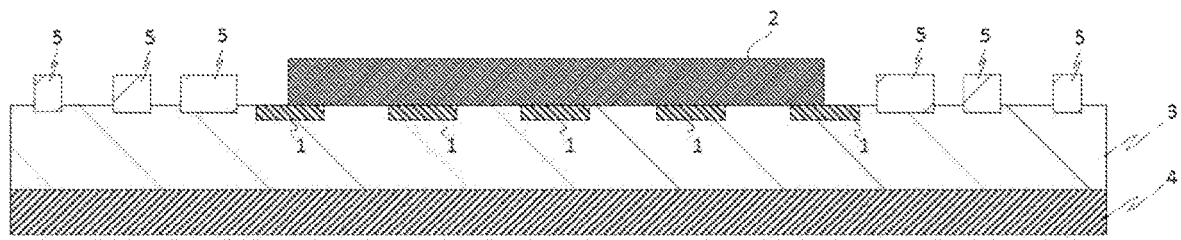
FIG. 3 is a schematic diagram illustrating one or more embodiments of a junction barrier Schottky diode (JBS).

FIG. 3 illustrates a junction barrier Schottky diode (JBS) according to one or more embodiments of the disclosure. The semiconductor device of FIG. 3 differs from the semiconductor device of FIG. 1 in that a guard ring 5 is further provided on an outer peripheral portion of the barrier electrode. This configuration of the semiconductor device of FIG. 3 enables the semiconductor device with enhanced semiconductor characteristics such as withstand voltage. According to one or more embodiments of the disclosure, by respectively embedding a portion of the guard ring 5 into a surface of the semiconductor region 3, it is possible to make a withstand voltage further enhanced more effectively. Further, by using a metal with high barrier height as the guard ring, it is possible to provide the guard ring industrially advantageously together with a formation of the barrier electrode without significantly affecting the semiconductor region, so that the guard ring can be formed without deteriorating an on-resistance.

A material with high barrier height is in general used as the guard ring. Examples of the material used as the guard ring include a conductive material with barrier height of equal to or more than 1 eV. The material used as the guard ring may be the same material as the electrode material described above. According to one or more embodiments of the disclosure, the material used in the guard ring is preferably the above mentioned metal, for a reason that larger flexibility in a design of a withstand-voltage structure can be provided, a large number of guard rings can be provided, and a withstand voltage can be flexibly made improved. A shape of the guard ring is not particularly limited, but may be square-shape, circular, channel-shape, L-shape or band-shape. While a number of the guard rings is not particularly limited, a number of the guard rings may be preferably three or more and more preferably six or more.

Figure 4A:
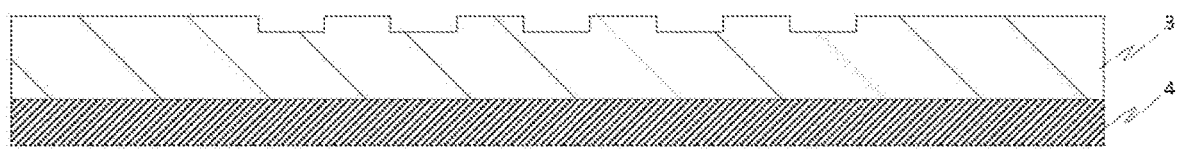
FIGS. 4(a)-4(d) are schematic diagrams illustrating one or more embodiments of a manufacturing process of the junction barrier Schottky diode (JBS) of FIG. 3.
Figure 4B:
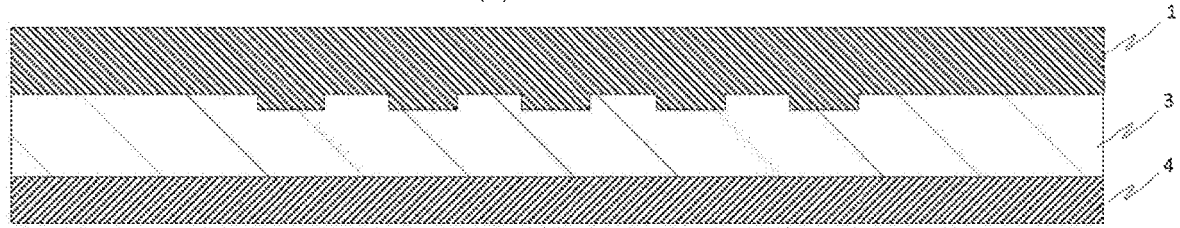
Figure 4C:
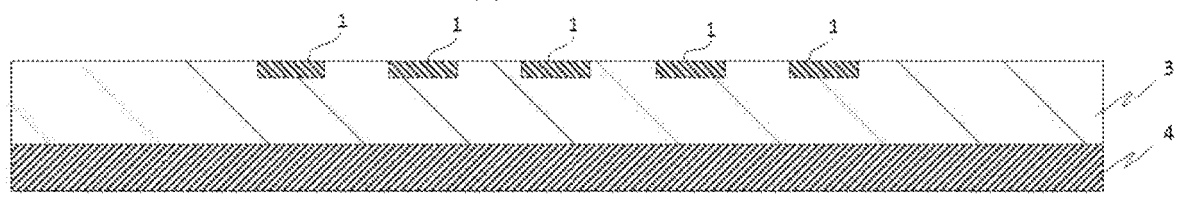

Hereinafter, with reference to FIG. 4 and FIG. 5, a preferred manufacturing process and the like of the semiconductor device of FIG. 3 is described. FIG. 4(a) illustrates a multilayer structure including a semiconductor substrate that is a semiconductor region 3, an Ohmic electrode 4 arranged on the semiconductor substrate, two or more trenches formed on a surface of the semiconductor substrate that is opposite to the Ohmic electrode of the semiconductor substrate. After forming an adjustment region of barrier height 1 on the semiconductor substrate 3 of the multilayer structure of FIG. 4(a) using a photolithography as illustrated in FIG. 4(b), exposing the semiconductor region, as illustrated in FIG. 4(c). The multilayer structure of FIG. 4(b) and FIG. 4(c) includes the adjustment region 1, the semiconductor region 3, and the Ohmic electrode 4. After obtaining the multilayer structure of FIG. 4(c), forming a barrier electrode 2 on the adjustment layer 1 and the semiconductor region 3 by using the dry method (preferably vacuum evaporation or sputtering) or the wet method, to obtain a multilayer structure of FIG. 4(d).

Figure 4D:
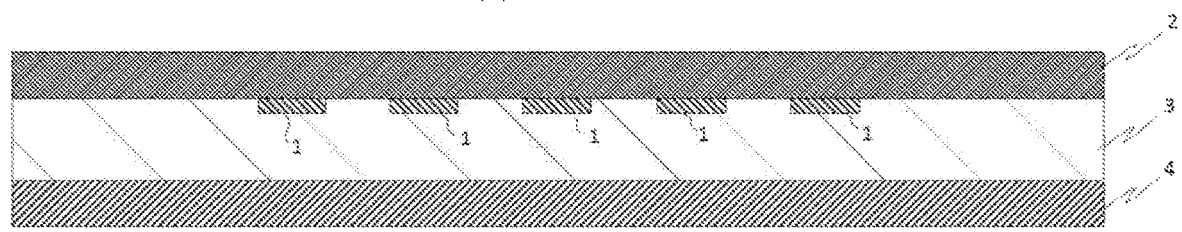
Figure 5E:
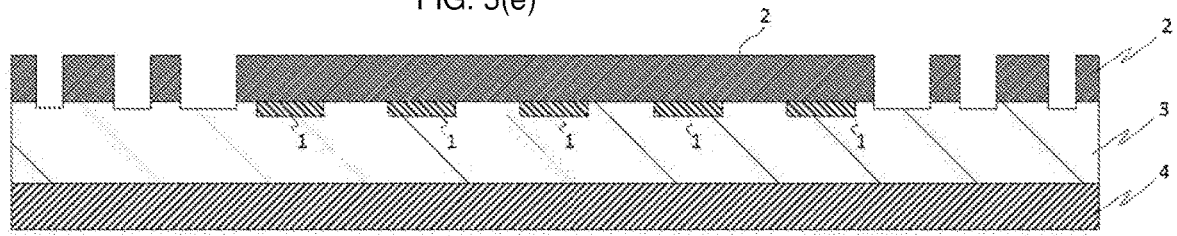
FIGS. 5(e)-5(g) are schematic diagrams illustrating one or more embodiments of a manufacturing process of the junction barrier Schottky diode (JBS) of FIG. 3.
Figure 5F:
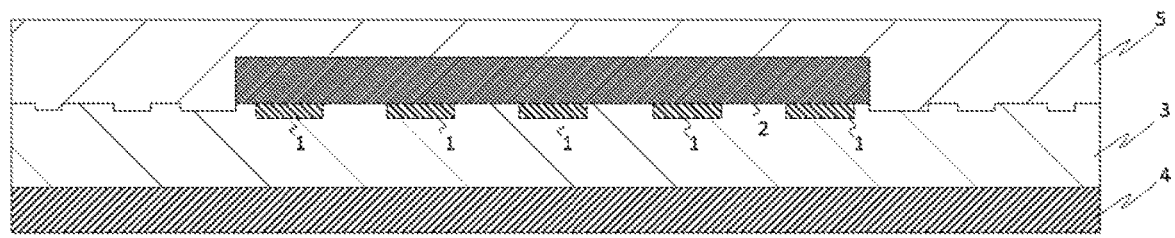
Figure 5G:
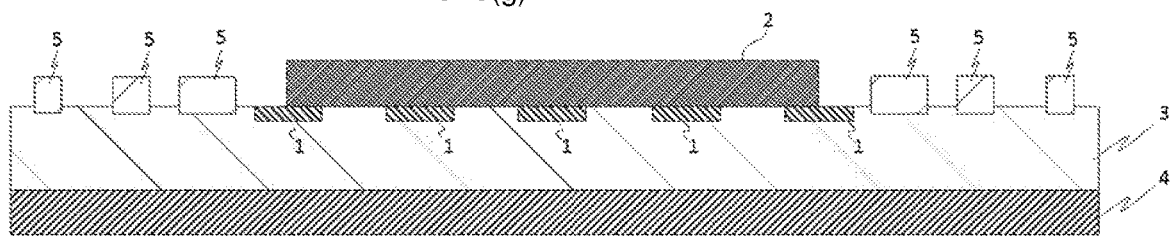

Then, removing a part of the barrier electrode 2 and a part of the semiconductor region 3 of the multilayer structure of FIG. 4(d) by etching using photolithography, as illustrated in FIG. 5(e). After obtaining the multilayer structure of FIG. 5(e), forming a guard ring 5 on the exposed portion of semiconductor region 3 by using the dry method (preferably vacuum evaporation or sputtering) or the wet method, to obtain a multilayer structure of FIG. 5(f). The multilayer structure of FIG. 5(f) includes the guard ring 5, the barrier electrode 2, the adjustment layer 1, the semiconductor region 3 and the Ohmic electrode 4. After obtaining the multilayer structure of FIG. 5(f), removing unnecessary parts by etching using photolithography, to obtain a multilayer structure of FIG. 5(g). The multilayer structure of FIG. 5(g), the adjustment layer 1 is embedded in the semiconductor region 3 and the guard ring 5 is embedded in the peripheral portion of the semiconductor region 3, and thus, is further excellent in withstand voltage and the like.

In the above description, the guard ring 5 is formed at the end of the process, however, according to one or more embodiments of the disclosure, it is also preferable to forming the guard ring 5 prior to form the barrier electrode 2, for a reason that it is possible to suppress affecting by metal at the time of forming electrodes.

Figure 11:
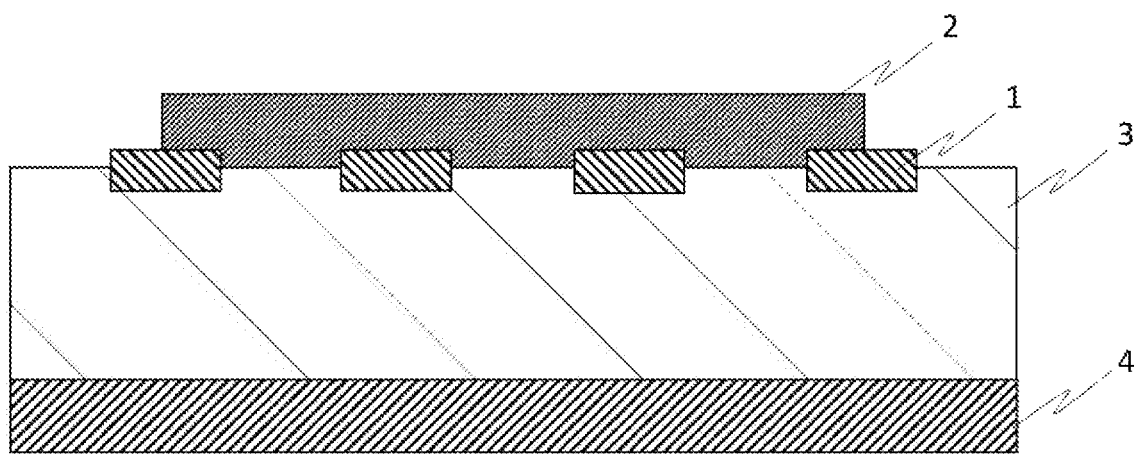
FIG. 11 is a schematic diagram illustrating one or more embodiments of a junction barrier Schottky diode (JBS).

FIG. 11 illustrates a junction barrier Schottky diode (JBS) according to one or more embodiments of the disclosure. The semiconductor device of FIG. 11 includes a semiconductor region 3, a barrier electrode 2 that is provided on the semiconductor region and capable of forming a Schottky barrier with the semiconductor region, and an adjustment layer of barrier height that is provided between the barrier electrode 2 and the semiconductor region 3 and capable of forming a Schottky barrier with the semiconductor region. Here, barrier height at an interface between the adjustment layer 1 and the semiconductor region 3 is higher than barrier height at an interface between the barrier electrode 2 and the semiconductor region 3. The adjustment layer 1 is embedded in the semiconductor region 3, and protrude from the semiconductor region 3 into the barrier electrode 2. According to one or more embodiments of the disclosure, the adjustment layer is preferably provided at regular intervals, and is more preferably provided respectively between the semiconductor region and both ends of the barrier electrode. Such a preferable embodiment enables a JBS with an excellent semiconductor properties such as enhanced thermal stability and adhesion, further reduced current leakage, further suppressed electric field concentration, and further reduced contact resistance. The semiconductor device of FIG. 11 further includes an Ohmic electrode 4 that is provided on an opposite side of the semiconductor region 3 to the barrier electrode 2.

Examples of a method of forming each layer of the semiconductor device of FIG. 11 includes the above described method of forming the each layer.

Figure 12A:
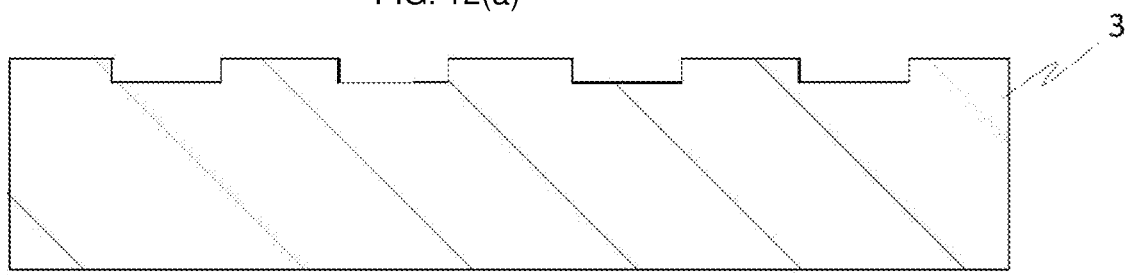
FIGS. 12(a)-12(d) are schematic diagrams illustrating one or more embodiments of a manufacturing process of the junction barrier Schottky diode (JBS) of FIG. 11.
Figure 12B:
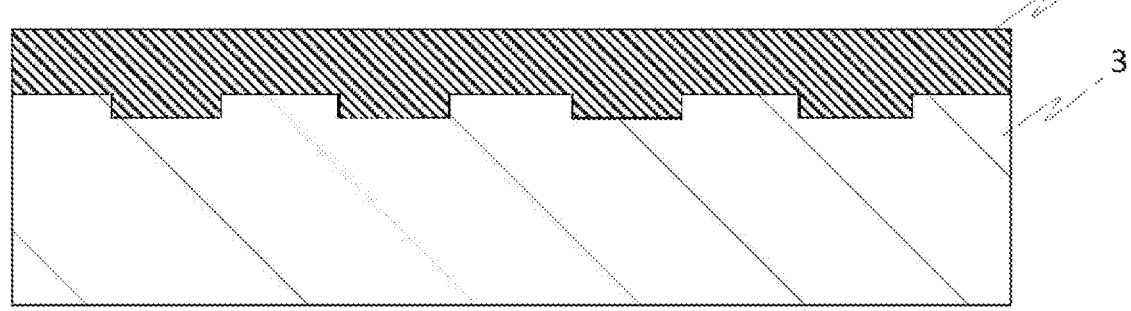
Figure 12C:
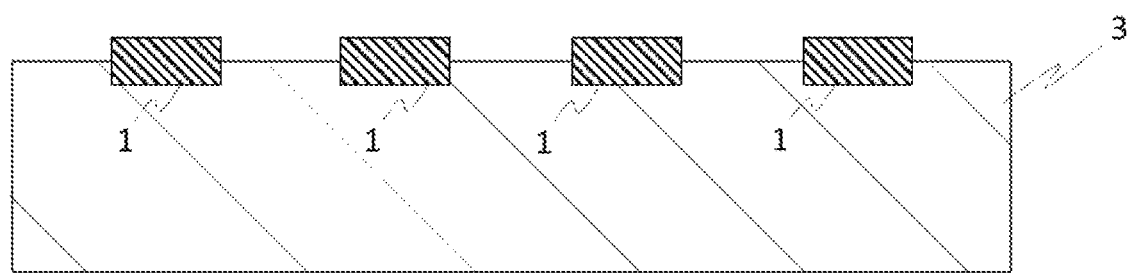
Figure 12D:
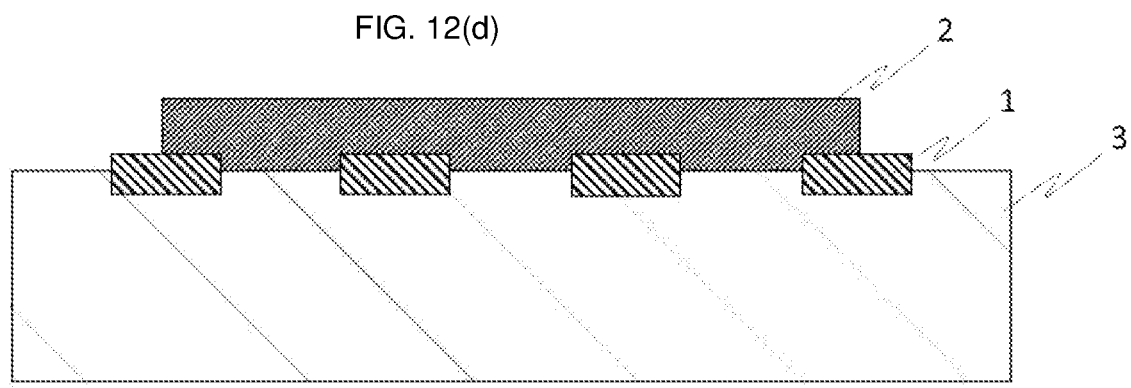

Hereinafter, with reference to FIG. 12, a preferred manufacturing process and the like of the semiconductor device of FIG. 11 is described. FIG. 12(a) illustrates a multilayer structure including a semiconductor substrate that is a semiconductor region 3 and two more trenches formed on a surface of the semiconductor region 3. Forming a p-type oxide semiconductor containing gallium as an adjustment layer of barrier height 1 by mist CVD method, on the semiconductor substrate, to obtain a multilayer structure of FIG. 12(b). With respect to the obtained multilayer structure of FIG. 12(b), removing unnecessary parts by etching using photolithography, to obtain a multilayer structure illustrated in FIG. 12(c). After obtaining the multilayer structure of FIG. 12(c), forming a barrier electrode 2 on the adjustment layer 1 and the semiconductor region 3 by using the dry method (preferably vacuum evaporation or sputtering) or the wet method, to obtain a multilayer structure of FIG. 12(d). The multilayer structure of FIG. 12(d) has a structure where the adjustment layer 1 is embedded in the semiconductor region 3 and protrude into the barrier electrode, and thus, enables to further suppress an electric field concentration and reduce a contact resistance, and thus, particularly useful for semiconductor devices of enhanced withstand voltage.

Figure 13:
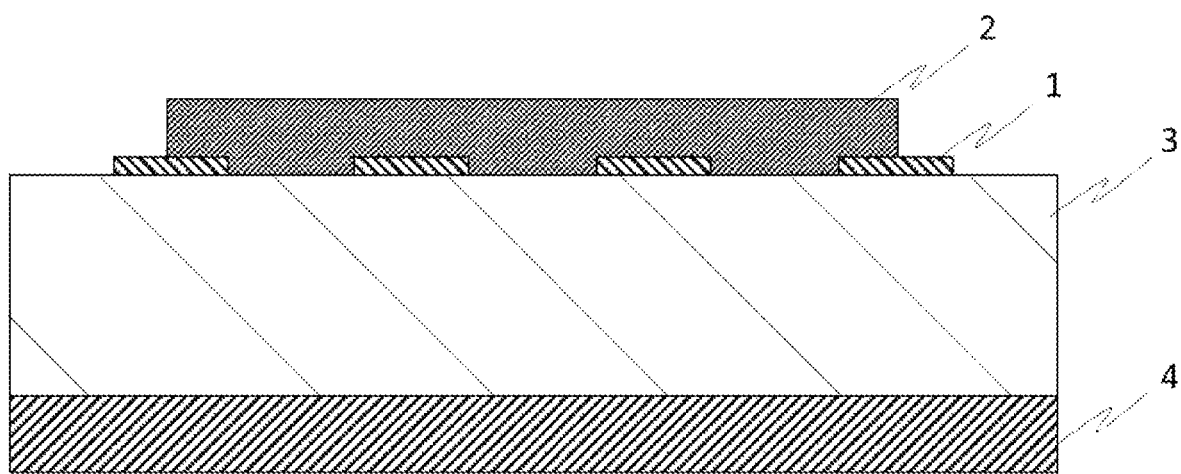
FIG. 13 is a schematic diagram illustrating one or more embodiments of a junction barrier Schottky diode (JBS).

FIG. 13 illustrates a junction barrier Schottky diode (JBS) according to one or more embodiments of the disclosure. The semiconductor device of FIG. 13 includes a semiconductor region 3, barrier electrode 2 that is provided on the semiconductor region and capable of forming a Schottky barrier with the semiconductor region, and an adjustment layer of barrier height that is provided between the barrier electrode 2 and the semiconductor region 3 and capable of forming a Schottky barrier with the semiconductor region. Here, barrier height at an interface between the adjustment layer 1 and the semiconductor region 3 is higher than barrier height at an interface between the barrier electrode 2 and the semiconductor region 3. The adjustment layer 1 is arranged on the semiconductor region 3, and protrude into the barrier electrode 2. According to one or more embodiments of the disclosure, the adjustment layer is preferably provided at regular intervals, and is more preferably provided respectively between the semiconductor region and both ends of the barrier electrode. Such a preferable embodiment enables the JBS with an excellent semiconductor properties such as enhanced thermal stability and adhesion, further reduced current leakage, further suppressed electric field concentration, and further reduced contact resistance. The semiconductor device of FIG. 13 further includes an Ohmic electrode 4 that is provided on an opposite side of the semiconductor region 3 to the barrier electrode 2.

Examples of a method of forming each layer of the semiconductor device of FIG. 13 includes the above described method of forming the each layer.

Figure 14A:
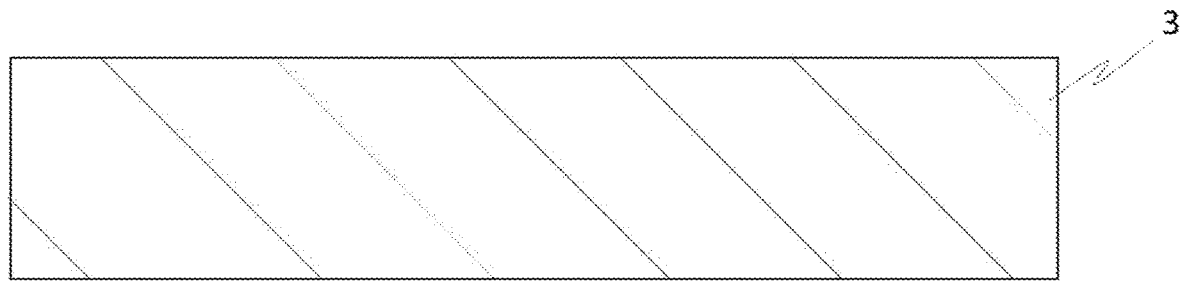
FIGS. 14(a)-14(d) are schematic diagrams illustrating one or more embodiments of a manufacturing process of the junction barrier Schottky diode (JBS) of FIG. 13.
Figure 14B:
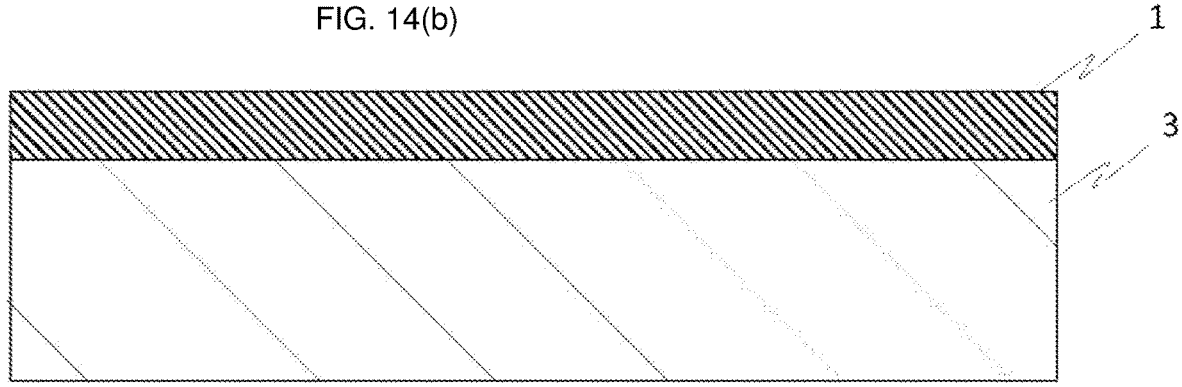
Figure 14C:
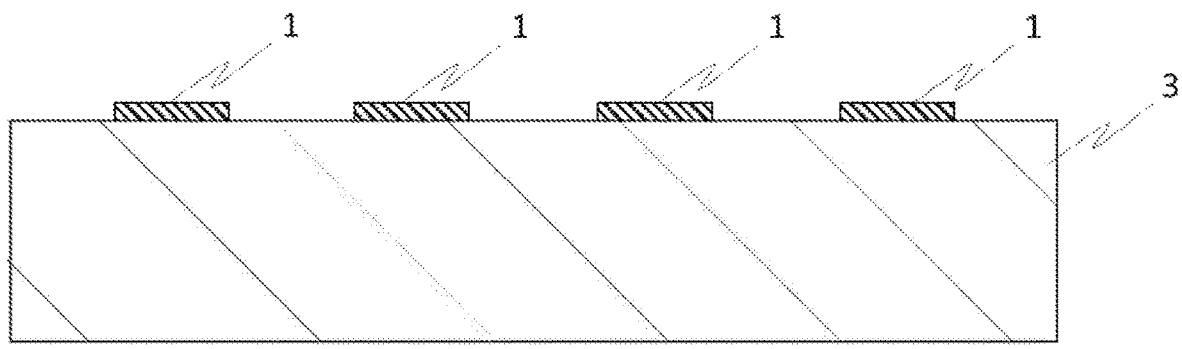
Figure 14D:
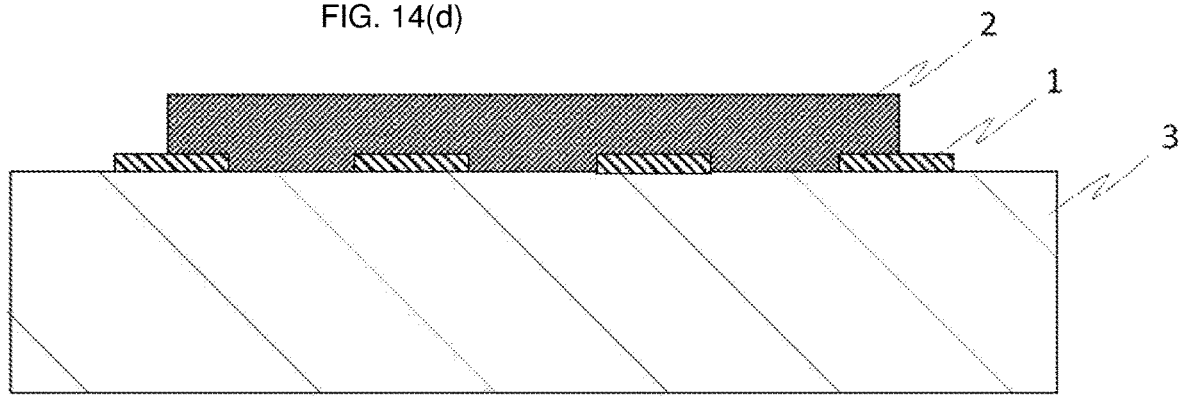

Hereinafter, with reference to FIG. 14, a preferred manufacturing process and the like of the semiconductor device of FIG. 13 is described. FIG. 14(a) illustrates a multilayer structure including a semiconductor substrate that is a semiconductor region 3. Forming a p-type oxide semiconductor containing gallium as an adjustment of barrier height layer by mist CVD, on the semiconductor substrate, to obtain a multilayer structure of FIG. 14(b). With respect to the obtained multilayer structure of FIG. 14(b), removing unnecessary parts by etching using photolithography, to obtain a multilayer structure of FIG. 14(c). After obtaining the multilayer structure of FIG. 14(c), forming a barrier electrode 2 on the adjustment layer 1 and the semiconductor region 3 by using the dry method (preferably vacuum evaporation or sputtering), to obtain a multilayer structure of FIG. 14(d). The multilayer structure of FIG. 14(d) has a structure where the adjustment layer 1 is embedded in the semiconductor region 3 and protrude into the barrier electrode, and thus, enables to further suppress an electric field concentration and reduce a contact resistance, and thus, particularly useful for semiconductor devices of enhanced withstand voltage.

Figure 15:
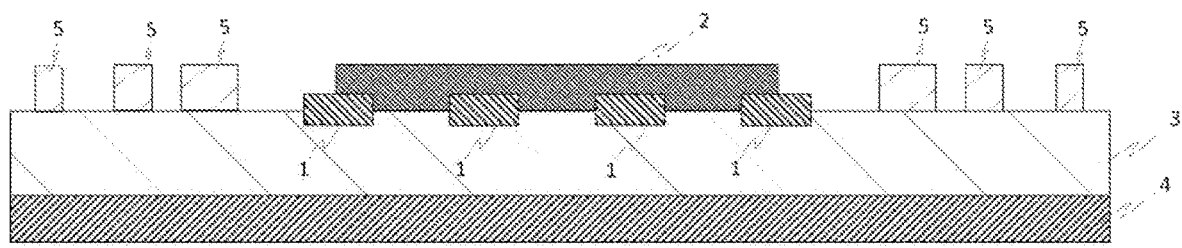
FIG. 15 is a schematic diagram illustrating one or more embodiments of a junction barrier Schottky diode (JBS).
Figure 17:
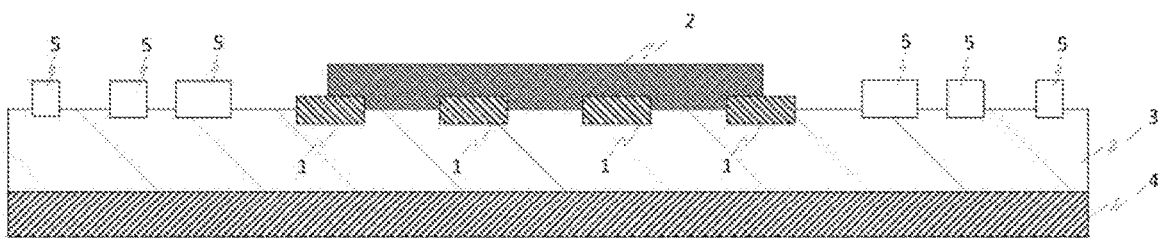
FIG. 17 is a schematic diagram illustrating one or more embodiments of a junction barrier Schottky diode (JBS).

FIG. 15 illustrates a junction barrier Schottky diode (JBS) according to one or more embodiments of the disclosure. The semiconductor device of FIG. 15 differs from the semiconductor device of FIG. 11 in that a guard ring 5 is provided on an outer peripheral portion of a barrier electrode. This configuration of the semiconductor device of FIG. 15 enables the semiconductor device with enhanced semiconductor characteristics such as withstand voltage. According to one or more embodiments of the disclosure, by respectively embedding a portion of the guard ring 5 into a surface of the semiconductor region 3 as illustrated in FIG. 17, it is possible to make a withstand voltage further enhanced more effectively. Further, by using a metal with high barrier height as the guard ring, it is possible to provide the guard ring industrially advantageously together with a formation of the barrier electrode without significantly affecting the semiconductor region, so that the guard ring can be formed without deteriorating an on-resistance.

Figure 16:
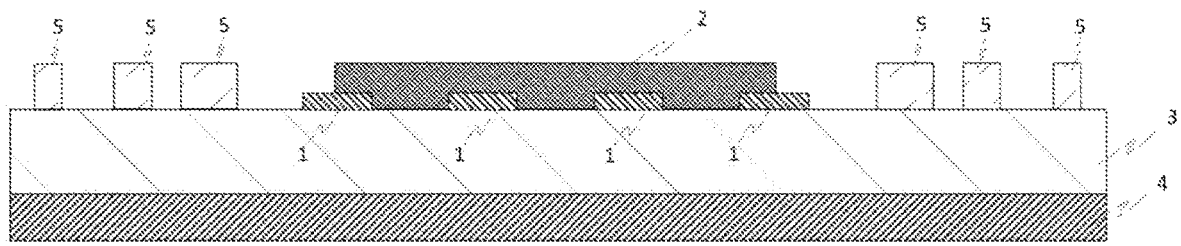
FIG. 16 is a schematic diagram illustrating one or more embodiments of a junction barrier Schottky diode (JBS).
Figure 18:
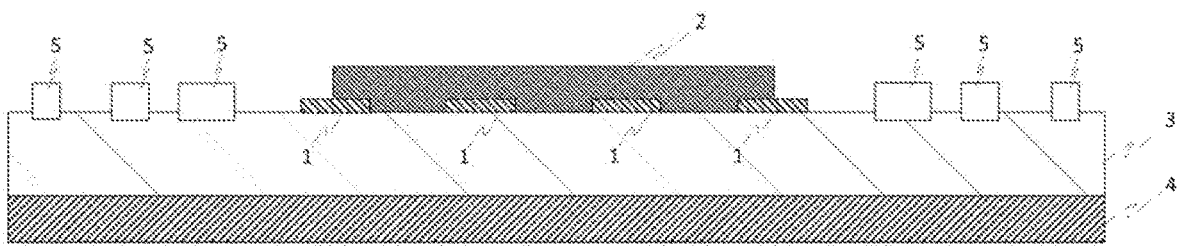
FIG. 18 is a schematic diagram illustrating one or more embodiments of a junction barrier Schottky diode (JBS).

FIG. 16 illustrates a junction barrier Schottky diode (JBS) according to one or more embodiments of the disclosure. The semiconductor device of FIG. 16 differs from the semiconductor device of FIG. 13 in that a guard ring 5 is provided on an outer peripheral portion of a barrier electrode. This configuration of the semiconductor device of FIG. 16 enables the semiconductor device with enhanced semiconductor characteristics such as withstand voltage. According to one or more embodiments of the disclosure, by respectively embedding a portion of the guard ring 5 into a surface of the semiconductor region 3 as illustrated in FIG. 18, it is possible to make a withstand voltage further enhanced more effectively. Further, by using a metal with high barrier height as the guard ring, it is possible to provide the guard ring industrially advantageously together with a formation of the barrier electrode without significantly affecting the semiconductor region, so that the guard ring can be formed without deteriorating an on-resistance.

The semiconductor device is particularly useful for power devices. Examples of the semiconductor device include a diode or transistor (e.g., MESFET, etc.). Among all, a diode is preferable and a junction barrier Schottky diode (JBS) is more preferable.

In addition, the semiconductor device according to the disclosure may be used as a power module, an inverter, and/or a converter in combination with a known structure. Also, a semiconductor device according to the disclosure may be used in a semiconductor system including a power source, to which the semiconductor device may be electrically connected by a known structure and/or method. The semiconductor device may be electrically connected to a wiring pattern in the semiconductor system.

Figure 6:
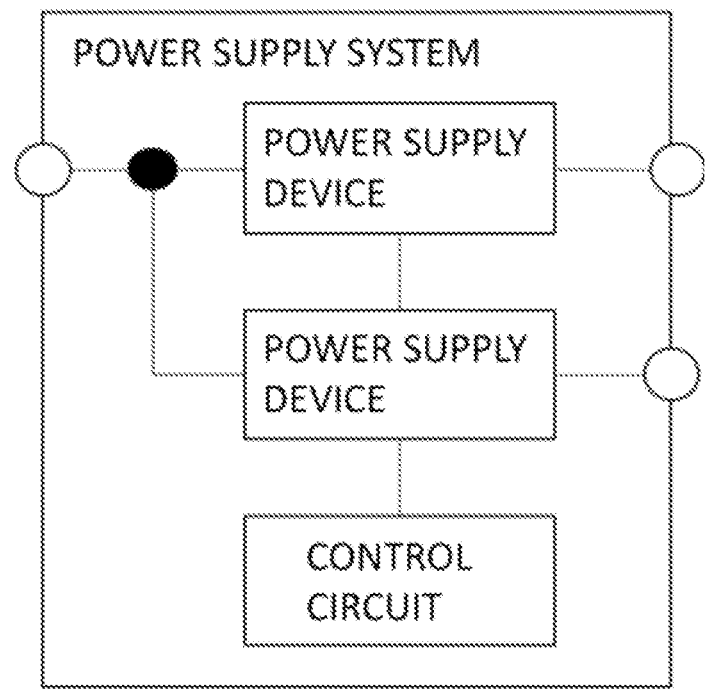
FIG. 6 is a schematic diagram illustrating one or more embodiments of a power source system.
Figure 7:
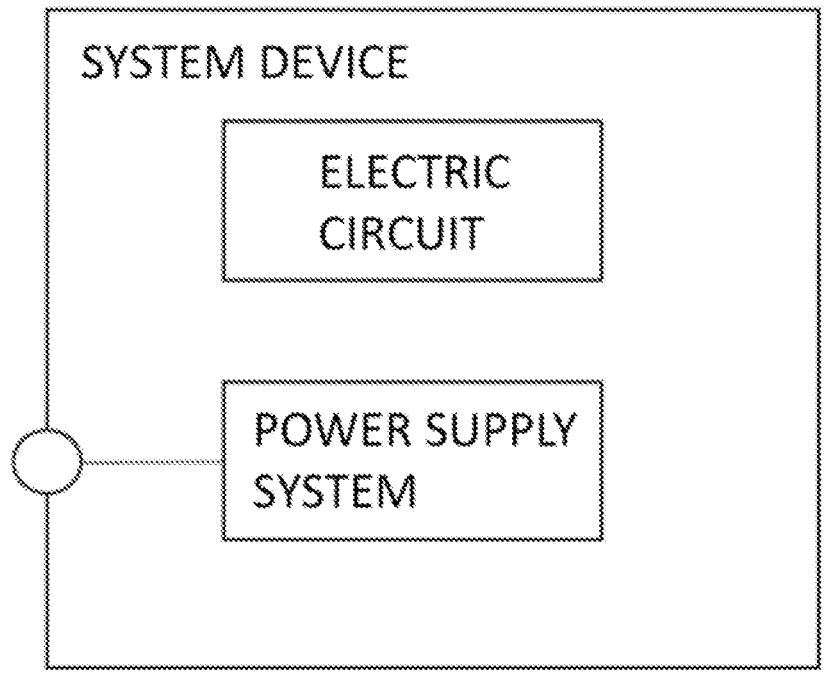
FIG. 7 is a schematic diagram illustrating one or more embodiments of a system device.
Figure 8:
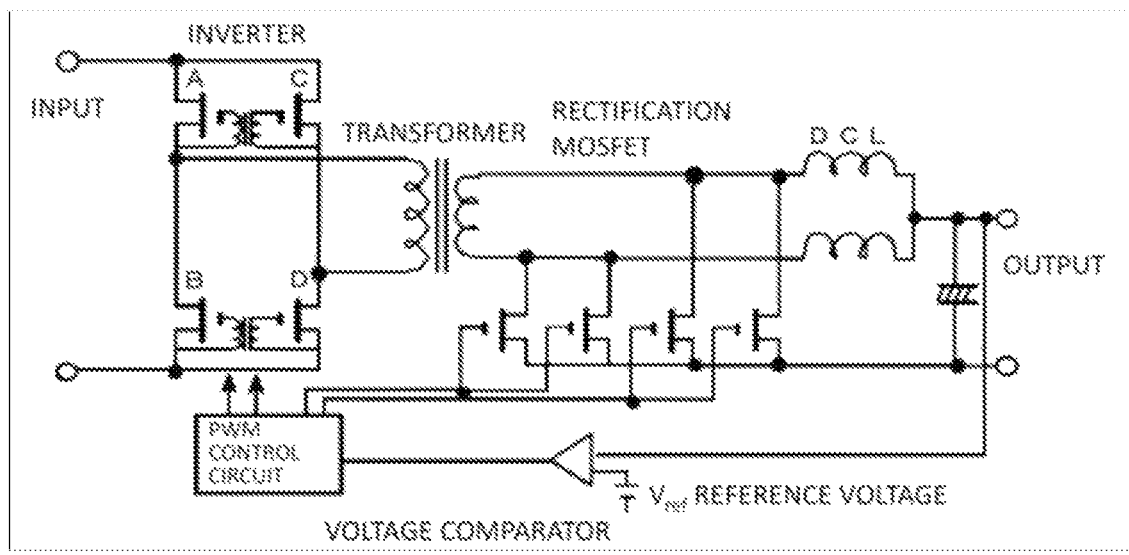
FIG. 8 is a schematic diagram illustrating one or more embodiments of circuit diagram of power source device.

FIG. 6 is a schematic view of a circuit diagram illustrating a power source system according to one or more embodiments of the disclosure. FIG. 6 illustrates a schematic view of the power source system using two or more power source devices and a control circuit. The power source system is, as illustrated in FIG. 7, used for a system device in combination with a circuit diagram. Also, FIG. 8 illustrates a power source circuit of a power source device, including a power circuit and a control circuit. A DC voltage is switched at high frequencies by an inverter (configured with MOSFET A to D) to be converted to AC, followed by insulation and transformation by a transformer. The voltage is then rectified by a rectification MOSFET and then smoothed by a DCL (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

EXAMPLE

Reference Example 1

Figure 9:
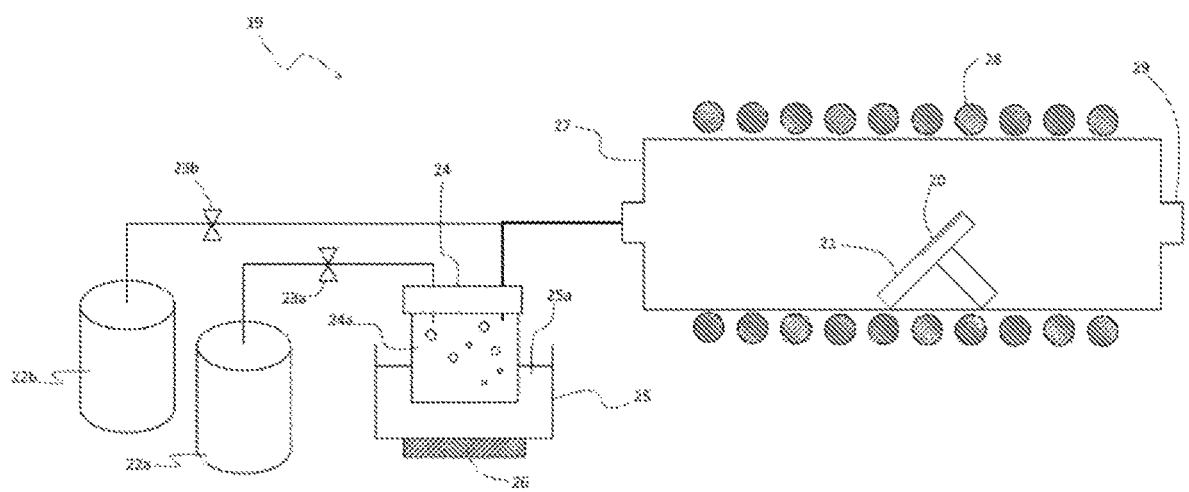
FIG. 9 is a schematic configuration diagram illustrating one or more embodiments of a deposition apparatus (mist CVD apparatus) used in a reference example.

Adjusting Barrier Height by Annealing 1-1. Deposition of an N-Type Semiconductor Layer
1-1-1. Deposition Apparatus With reference to FIG. 9, a mist CVD apparatus 19 used in a reference example is described. The mist CVD apparatus 19 includes a susceptor 21 on which a substrate 20 is placed, a carrier gas supply device 22a to supply a carrier gas, a flow control valve 23a that is configured to control a flow rate of the carrier gas supplied from the carrier gas supply device 22a, a carrier gas (diluted) supply device 22b to supply a carrier gas (diluted), a flow control valve 23b that is configured to control a flow rate of the carrier gas supplied from the carrier gas (diluted) supply device 22b, a mist generator 24 containing a raw material solution 24a, a container 25 containing water 25a, an ultrasonic transducer 26 attached to a bottom of the container 25, a supply pipe 27 made of a quartz tube having an inner diameter of 40 mm, and a heater 28 arranged at a peripheral portion of the supply pipe 27. The susceptor 21 is made of quartz. The susceptor 21 includes a surface that is slanted off the horizontal and on that the substrate is arranged. Since the susceptor 21 and the supply pipe 27 that is configured to be a deposition chamber are made of quartz, impurities from the device that is introduced into a film formed on the substrate 20 is suppressed.

1-1-2. Preparation of a Raw Material Solution

Hydrobromic acid was contained at a volume ratio of 20% in a 0.1 M aqueous gallium bromide solution to make a raw material solution.

1-1-3. Deposition Preparation

The raw material solution 24a obtained at 1-1-2. was set in the mist generator 24. Then, as the substrate 20, a sapphire substrate was placed on the susceptor 21, and the heater 28 was activated to raise a temperature in the deposition chamber 27 up to 480° C. The flow control valves 23a and 23b were opened to supply a carrier gas from the carrier gas supply devices 22a and 22b that are carrier gas source into the deposition chamber 27 to replace an atmosphere in the deposition chamber with the carrier gas. After the atmosphere in the deposition chamber 27 was sufficiently replaced with the carrier gas, a flow rate of the carrier gas was adjusted at 5 L/min and a flow rate of the carrier gas (diluted) was adjusted at 0.5 L/min. In this embodiment, nitrogen was used as the carrier gas.

1-1-4. Deposition of a Semiconductor Film

The ultrasonic transducer 26 was then vibrated at 2.4 MHz, and the vibration propagated through the water 25a to the raw material solution 24a, to atomize the raw material solution 24a to form a mist. The mist was introduced into the deposition chamber 27 by the carrier gas. The mist reacted at 510° C. under an atmospheric pressure to deposit a semiconductor film on the substrate 20. A film thickness was 2.5 µm, and a deposition time was 180 minutes.

1-1-5. Evaluation

The obtained film at 1-1-4. was identified by X-ray diffraction device and revealed to be $\alpha$-$Ga_2O_3$.

1-2. Deposition of an N+ Type Semiconductor Layer

A semiconductor film was deposited on the n--type semiconductor layer obtained at 1-1 by a method similar to the method of 1-1. except the following conditions: hydrochloric acid and tin chloride were contained at a volume ratio of 1.5% and 0.2% respectively in 0.05 M gallium acetylacetonate aqueous solution to make a raw material solution. The obtained film was identified by X-ray diffraction device and revealed to be $\alpha$-$Ga_2O_3$.

1-3. Formation of an Ohmic Electrode

A Ti layer and an Au layer were respectively deposited on the n+-type semiconductor layer by electron beam evaporation. A thickness of the Ti layer was 35 nm, and a thickness of the Au layer was 175 nm.

1-4. Formation of a Schottky Electrode

After peeling off the sapphire substrate, a Pt layer was deposited on the n--type semiconductor layer by electron beam evaporation. Then, the Pt layer was annealed at a temperature of 400° C. for 30 seconds in a nitrogen atmosphere, by using a rapid thermal anneal (RTA) apparatus. Also, unannealed Pt layer was also formed by photolithography and etching.

1-5. Evaluation

Figure 10A:
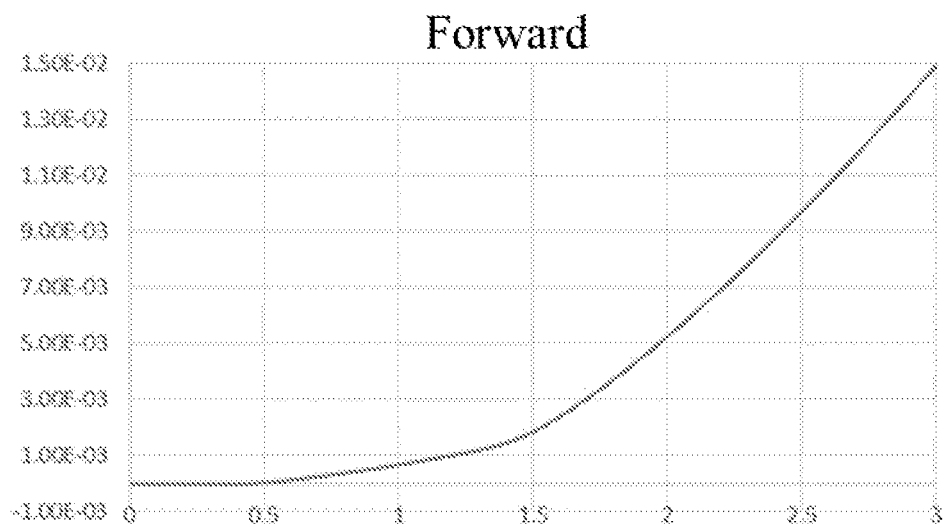
FIGS. 10(a)-10(b) are schematic diagrams illustrating the I-V measurement results in a reference example.
Figure 10B:
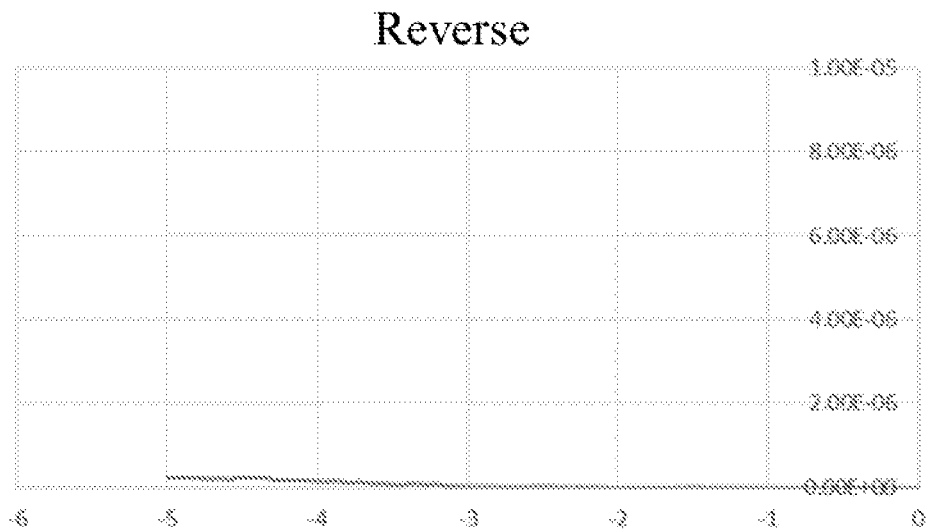

I-V measurements were performed. As a result, barrier height of the unannealed Pt layer was 1.5 eV, and barrier height of the annealed Pt layer was 0.9 eV. The results of the I-V measurement of the annealed Pt layer is illustrated in FIG. 10.

Reference Example 2

Adjusting Barrier Height by Using a P-Type Semiconductor)

In a reference example 2, an adjustment of barrier height by using a p-type semiconductor was evaluated.

2-1. Deposition of a P-Type Semiconductor Layer

A semiconductor film was deposited by a method similar to the method in 1-1 except the following conditions: gallium bromide and magnesium bromide were mixed in ultrapure water to be a raw material solution such that the atomic ratio of magnesium to gallium is 1:0.01 and gallium bromide is 0.1 mol/L, and the raw material solution contains hydrohalic acid to be 20% by volume ratio, a flow rate of a carrier gas was adjusted at 1 L/min and a flow rate of a carrier gas (diluted) was adjusted at 1 L/min, a temperature during a deposition of a film was 520° C., and a deposition time was 60 minutes. The obtained film in which a hydrobromic acid was used as hydrohalic acid, was identified by X-ray diffraction device, and revealed to be $\alpha$-Ga$_2$O$_3$.

2-2. Evaluation

In order to confirm whether magnesium works properly as a p-type dopant in a p-type semiconductor layer, I-V measurement was conducted on the $\alpha$-Ga$_2$O$_3$ film obtained in at 2-1. As a result, excellent rectifying property was observed and the n+-type semiconductor layer and the p-type semiconductor layer formed a good PN junction. Since magnesium works properly as a p-type dopant it was revealed that barrier height may be adjusted by forming a p-type semiconductor.

INDUSTRIAL APPLICABILITY

The semiconductor device according to one or more embodiments of the disclosure can be used in various fields such as semiconductors (e.g., compound semiconductor electronic devices), electronic parts, electric equipment parts, optical electrophotographic related apparatus, industrial members, and especially useful for power devices.

REFERENCE NUMBER DESCRIPTION 1 adjustment layer (region) of barrier height
2 barrier electrode
3 semiconductor region
4 Ohmic electrode
5 guard ring
19 mist CVD apparatus
20 substrate
21 susceptor
22a carrier gas supply device
22b carrier gas (diluted) supply device
23a flow control valve
23b flow control valve
24 mist generator
24a raw material solution
25 container
25a water
26 ultrasonic transducer
27 supply pipe
28 heater
29 air outlet

What is claimed is:

1. A semiconductor device comprising:
a semiconductor region including an oxide semiconductor as a major component;
a barrier electrode arranged on the semiconductor region; and
two or more adjustment regions of barrier height that are on a surface of the semiconductor region and arranged between the semiconductor region and the barrier electrode,
wherein the adjustment regions are configured such that barrier height at an interface between the adjustment regions and the semiconductor region or the barrier electrode is higher than barrier height at an interface between the semiconductor region and the barrier electrode,
wherein the adjustment regions include a p-type oxide semiconductor as a major component, and
wherein the p-type oxide semiconductor includes gallium.

2. The semiconductor device of claim 1,
wherein a first adjustment region of the two or more adjustment regions is arranged between a first end of the barrier electrode and the semiconductor region, and a second adjustment region of the two or more adjustment regions is arranged between a second end of the barrier electrode and the semiconductor region.

3. The semiconductor device of claim 1,
wherein the adjustment regions protrude into the barrier electrode.

4. The semiconductor device of claim 1, further comprising:
a guard ring that is arranged at a peripheral portion of the barrier electrode.

5. The semiconductor device of claim 4,
wherein the guard ring is partly or wholly embedded in the surface of the semiconductor region.

6. The semiconductor device of claim 1,
wherein the barrier height at the interface between the barrier electrode and the adjustment regions is equal to or higher than 1 eV.

7. The semiconductor device of claim 1,
wherein the barrier electrode includes a metal as an electrode material.

8. The semiconductor device of claim 1,
wherein the semiconductor region includes a crystalline oxide semiconductor as a major component.

9. The semiconductor device of claim 1,
wherein the semiconductor region includes a gallium compound as a major component.

10. The semiconductor device of claim 1,
wherein the semiconductor region includes $\alpha$-Ga$_2$O$_3$ or a mixed crystal of $\alpha$-Ga$_2$O$_3$ as a major component.

11. The semiconductor device of claim 1,
wherein the adjustment regions are embedded in the surface of the semiconductor region.

12. The semiconductor device of claim 1,
wherein the adjustment regions include, as a major component, a corundum-structured p-type oxide semiconductor or a hexagonal-structured p-type oxide semiconductor.

13. The semiconductor device of claim 1,
wherein the semiconductor device is a diode.

14. The semiconductor device of claim 1,
wherein the semiconductor device is a junction barrier Schottky diode.

15. The semiconductor device of claim 1, wherein the semiconductor device is a power device.

16. A semiconductor system comprising:
the semiconductor device of claim 1.

17. A semiconductor device comprising:
a semiconductor region including an oxide semiconductor as a major component;
a barrier electrode arranged on the semiconductor region; and
two or more adjustment regions of barrier height that are on a surface of the semiconductor region and arranged between the semiconductor region and the barrier electrode,
wherein the adjustment regions are configured such that barrier height at an interface between the adjustment regions and the semiconductor region or the barrier electrode is higher than barrier height at an interface between the semiconductor region and the barrier electrode, and
wherein the adjustment regions are made of metal.

18. A semiconductor device comprising:
a semiconductor region including an oxide semiconductor as a major component;
a barrier electrode arranged on the semiconductor region; and
two or more adjustment regions of barrier height that are on a surface of the semiconductor region and arranged between the semiconductor region and the barrier electrode,
wherein the adjustment regions are configured such that barrier height at an interface between the adjustment regions and the semiconductor region or the barrier electrode is higher than barrier height at an interface between the semiconductor region and the barrier electrode, and
wherein the adjustment regions include a corundum-structured p-type oxide semiconductor as a major component.

* * * * *